(12) United States Patent
Wei et al.

(10) Patent No.: US 11,189,465 B2
(45) Date of Patent: Nov. 30, 2021

(54) ADJUSTABLE CAPACITOR, IMPEDANCE MATCHING DEVICE AND SEMICONDUCTOR PROCESSING APPARATUS

(71) Applicant: BEIJING NAURA MICROELECTRONICS EQUIPMENT CO., LTD., Beijing (CN)

(72) Inventors: Gang Wei, Beijing (CN); Xiaoyang Cheng, Beijing (CN)

(73) Assignee: BEIJING NAURA MICROELECTRONICS EQUIPMENT CO., LTD., Beijing (CN)

(*) Notice: Subject to any disclaimer, the term of this patent is extended or adjusted under 35 U.S.C. 154(b) by 26 days.

(21) Appl. No.: 16/625,629

(22) PCT Filed: Oct. 18, 2017

(86) PCT No.: PCT/CN2017/106668
§ 371 (c)(1),
(2) Date: Dec. 20, 2019

(87) PCT Pub. No.: WO2018/233156
PCT Pub. Date: Dec. 27, 2018

(65) Prior Publication Data
US 2020/0321194 A1    Oct. 8, 2020

(30) Foreign Application Priority Data

Jun. 23, 2017   (CN) .......................... 201710485860.2

(51) Int. Cl.
*H01J 37/32*   (2006.01)
*H01G 7/06*   (2006.01)
(Continued)

(52) U.S. Cl.
CPC .......... *H01J 37/32183* (2013.01); *H01G 7/06* (2013.01); *H01L 21/67069* (2013.01); *H03H 7/42* (2013.01)

(58) Field of Classification Search
CPC .......... H01L 21/67069; H01J 37/32183; H03H 7/40; H03H 7/42; H01G 7/06; H05H 1/46
See application file for complete search history.

(56) References Cited

U.S. PATENT DOCUMENTS

| 3,569,795 | A | * | 3/1971 | Gikow | ..................... H01G 7/06 361/434 |
| 5,280,407 | A | | 1/1994 | Brennan | |
| 2011/0037536 | A1 | * | 2/2011 | Kanno | ................... H01G 4/005 333/185 |

FOREIGN PATENT DOCUMENTS

| CN | 101567266 A | 10/2009 |
| CN | 101682315 A | 3/2010 |

(Continued)

OTHER PUBLICATIONS

The World Intellectual Property Organization (WIPO) International Search Report for PCT/CN2017/106668 dated Mar. 22, 2018 6 Pages.

*Primary Examiner* — Yuechuan Yu
(74) *Attorney, Agent, or Firm* — Anova Law Group, PLLC

(57) ABSTRACT

The present disclosure provides an adjustable capacitor comprising a ferroelectric dielectric layer, a first electrode and a second electrode disposed on opposite sides of the ferroelectric dielectric layer. The adjustable capacitor further comprises a first control electrode and a second control electrode insulated from the first electrode and the second electrode. The first control electrode and the second control electrode are configured to provide an electric field to the ferroelectric dielectric layer, to adjust a dielectric constant of (Continued)

the ferroelectric dielectric layer by controlling an electric field strength, thereby adjusting the capacitance between the first and the second electrodes. The present disclosure also provides an impedance matching device and a semiconductor processing apparatus. The adjustable capacitor, the impedance matching device and the semiconductor processing apparatus can adjust the capacitance of the adjustable capacitor in milliseconds, thereby accelerating the matching speed, shortening the matching time, and improving the processed result.

19 Claims, 5 Drawing Sheets

(51) Int. Cl.
  *H01L 21/67* (2006.01)
  *H03H 7/42* (2006.01)

(56) References Cited

FOREIGN PATENT DOCUMENTS

| | | | |
|---|---|---|---|
| CN | 1325552 | A | 12/2011 |
| CN | 104349567 | A | 2/2015 |
| CN | 104882277 | A | 9/2015 |
| TW | I579875 | B | 4/2017 |

\* cited by examiner

ADJUSTABLE CAPACITOR, IMPEDANCE MATCHING DEVICE AND SEMICONDUCTOR PROCESSING APPARATUS

This application is a National Stage entry under § 371 of International Application No. PCT/CN2017/106668, filed on Oct. 18, 2017, and claims priority to Chinese Patent Application No. 201710485860.2, filed on Jun. 23, 2017, the entire contents of which are hereby incorporated as reference.

TECHNICAL FIELD

The present disclosure relates to the technical field of microelectronic processing, and in particular relates to an adjustable capacitor, an impedance matching device and a semiconductor processing apparatus.

BACKGROUND TECHNOLOGY

Plasma technology is widely used in the technical field of semiconductor manufacturing. In a plasma deposition and etching system, an RF power source is used to transmit energy to a reaction chamber to excite a processing gas in the chamber to form a plasma. The plasma contains a large amount of active particles, such as electrons, ions, excited atoms, molecules, and radicals. These active particles can have various physical and chemical reactions with the surface of a substrate disposed in the chamber and exposed to the plasma, to cause changes on the surface of the substrate, thereby completing processes such as etching and deposition.

In applications, the output impedance of the RF power source is usually 50Ω. In order to obtain a maximum power of the reaction chamber from the RF power source and decrease the reflected power of the reaction chamber, an impedance matching device is often disposed between the RF power source and the reaction chamber for matching the output impedance of the RF power source with the load impedance, the load impedance is equal to the sum of the impedance of the impedance matching device and the impedance of the reaction chamber.

FIG. 1 is a schematic block diagram of a semiconductor processing apparatus to which an existing impedance matching device is applied. As shown in FIG. 1, the impedance matching device is connected in series between the RF power source 10 and the reaction chamber 20, and includes a collection unit 1, a control unit 2, an execution unit 3, and a matching network 4, wherein the collection unit 1 is connected in series with the RF power source. Between the RF power source 10 and the matching network 4, the collection unit 1 is configured to collect electrical signals, i.e., voltage V, current I, from a transmission line on which it is disposed and send the signals to the control unit 2. The matching network 4 may include adjustable capacitors, C1 and C2, and a fixed inductor L. The execution unit 3 may include motors M1 and M2. The control unit 2 acquires the information about the varied capacitance of the capacitors C1 and C2 based on electrical signals sent by the collection unit 1 using an impedance matching algorithm, and controls rotations of the motors M1 and M2 based on the varied amount, thereby driving the mechanically adjustable end movement of the adjustable capacitors C1 and C2, to adjust the capacitances of the adjustable capacitors, C1 and C2, respectively. Based on the above, the impedance matching device matches the RF power source output impedance with the load impedance by adjusting the impedance of the impedance matching device itself.

However, the use of the impedance matching device as shown in FIG. 1 may inevitably cause the following problems in practical applications: the impedance matching device shown in FIG. 1 changes the capacitance of the capacitor by the rotation of the motor, and the impedance matching speed is affected by the rotational speed of the motor, which results in the matching speed usually in a second order, and would be difficult to achieve a matching speed in a millisecond order.

SUMMARY OF THE INVENTION

The present disclosure aims to solve at least one of the technical problems in the existing technologies, and provides an adjustable capacitor and an impedance matching device, which can adjust the capacitance of the adjustable capacitor in milliseconds or less, thereby achieving the matching speed in milliseconds or less.

In order to solve the above problems, the present disclosure provides an adjustable capacitor, the adjustable capacitor includes: a ferroelectric dielectric layer, and a first electrode and a second electrode on opposite sides to the ferroelectric dielectric layer. The adjustable capacitor includes a first control electrode and a second control electrode insulated from the first electrode and the second electrode. The first control electrode and the second control electrode are configured to provide an electric field to the ferroelectric dielectric layer to adjusts a dielectric constant of the ferroelectric dielectric layer by controlling an electric field strength and accordingly adjust a capacitance between the first electrode and the second electrode.

At least a portion of the ferroelectric dielectric layer is simultaneously disposed in an electric field between the first control electrode and the second control electrode and in an electric field between the first electrode and the second electrode.

The first electrode and the first control electrode are both disposed on an upper side of the ferroelectric dielectric layer, and the first electrode is disposed on a left side, the first control electrode is disposed on a right side. The second electrode and the second control electrode are both disposed on a lower side of the ferroelectric dielectric layer, and the second electrode is disposed on a right side, the second control electrode is disposed on a left side. Orthographic projections of the first control electrode and the second control electrode on an upper surface of the ferroelectric dielectric layer may not overlap.

The quantity of the second control electrodes is two, the second electrode is disposed between the two second control electrodes; the quantity of the first electrodes is two, the first control electrode is disposed between the two first electrodes.

The second control electrode is disposed opposite to the first electrode; the first control electrode is disposed opposite to the second electrode.

Orthographic projections of the second control electrode and the oppositely disposed first electrode on the ferroelectric dielectric layer are completely coincident; orthographic projections of the first control electrode and the oppositely disposed second electrode on the ferroelectric dielectric layer are completely coincident.

The first electrode and the second electrode are disposed on an upper side and a lower side of the ferroelectric dielectric layer, respectively; the first control electrode and the second control electrode are disposed on a left side and a right side of the ferroelectric dielectric layer, respectively.

The material for the ferroelectric dielectric layer includes at least one of: $BaTiO_3$, $BaO$—$TiO_2$, $KNbO_3$, $K_2O$—$Nb_2O_5$, $LiNbO_3$, $Li_2O$—$Nb_2O_5$, potassium dihydrogen phosphate, triglycine sulfate and Rochelle salt.

In another aspect, the present disclosure also provides an impedance matching device, including: a collection unit, a matching network, and a control unit, the matching network being serially connected between the RF power source and the reaction chamber, and the matching network may include an adjustable capacitor of any one of the foregoing solutions of the present disclosure; the first electrode and the second electrode are connected to a circuit of the matching network, and the first control electrode is electrically connected to the control unit; and the second control electrode is grounded. The collection unit is configured to collect electrical signals in a transmission line between the RF power source and the matching network, and send it to the control unit; the control unit is configured to perform an impedance matching operation based on the electrical signals collected by the collecting unit and to control a voltage applied between the first control electrode and the second control electrode based on an operation result, to adjust the capacitance between the first electrode and the second electrode.

The impedance matching device further includes a low-pass filter disposed between the control unit and the first control electrode.

The quantity of the adjustable capacitors is plural, the quantity of the low-pass filters is equal to the quantity of the adjustable capacitors, and the two are correspondingly configured.

In another aspect, the present disclosure further provides a semiconductor processing apparatus, including: an RF power source, an impedance matching device, and a reaction chamber, the impedance matching device is connected in series between the RF power source and the reaction chamber, wherein impedance matching device employs the impedance matching device of any of the foregoing solutions of the present disclosure.

The present disclosure has the following beneficial effects:

The adjustable capacitor provided by the embodiment of the present disclosure can control the strength of the electric field where the ferroelectric dielectric layer is disposed by controlling the voltage between the first control electrode and the second control electrode; a rapid change of the electric field strength can cause a rapid change of the dielectric constant of the ferroelectric dielectric layer, the rapid change of the dielectric constant can cause a rapid change of the capacitance between the first electrode and the second electrode, and therefore, compared to the existing mechanical adjustment method, the present disclosure can increase the adjustment rate of the capacitance value and shorten the adjustment time, to achieve adjusting the capacitor in a time period of milliseconds or less.

The impedance matching device provided by the embodiment of the present disclosure can achieve a matching speed of milliseconds by employing the adjustable capacitor provided by the embodiment of the present disclosure.

The semiconductor processing apparatus provided by the embodiment of the present disclosure can achieve fast matching between the output impedance of the RF power source and the load impedance by employing the impedance matching device provided by the embodiment of the present disclosure, thereby improving the processing efficiency and the processed result.

DETAILED DESCRIPTION OF THE EMBODIMENTS

Figure 1:
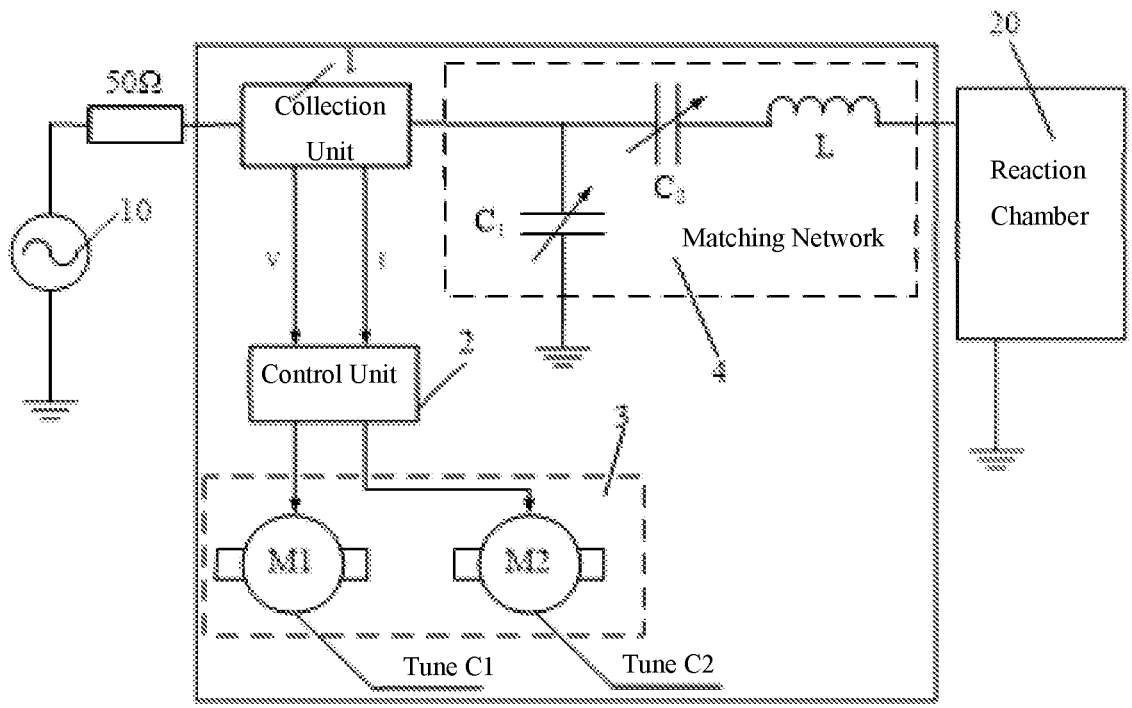
FIG. 1 is a schematic block diagram of a semiconductor processing apparatus employing an existing impedance matching device.

In order to enable those skilled in the art to better understand the technical solutions of the present disclosure, the adjustable capacitor, the impedance matching device and the semiconductor processing apparatus provided by the present disclosure are described in detail below with reference to the accompanying drawings.

Embodiment One

The current embodiment of the present disclosure provides an adjustable capacitor, the adjustable capacitor includes: a ferroelectric dielectric layer, and a first electrode and a second electrode disposed on opposite sides of the ferroelectric dielectric layer; the adjustable capacitor further includes a first control electrode and a second control electrode insulated from the first electrode and the second electrode; the first control electrode and the second control electrode are configured to provide an electric field to the ferroelectric dielectric layer to adjust a dielectric constant of the ferroelectric dielectric layer by controlling an electric field strength, thereby adjusting a capacitance of a capacitor between the first electrode and the second electrode. That is to say, the first electrode and the second electrode are two electrodes of the adjustable capacitor provided by the embodiment of the present disclosure, and the first control electrode and the second control electrode are control electrodes configured to control the dielectric constant of the adjustable capacitor and thereby adjust the capacitance.

The adjustable capacitor provided in this embodiment can control a strength of an electric field having the ferroelectric dielectric layer by controlling a voltage between the first control electrode and the second control electrode, and cause a rapid change of the voltage between the first control electrode and the second electrode which in turn can cause a rapid change of the electric field strength. The rapid change of the electric field strength can cause a rapid change of the dielectric constant of the ferroelectric dielectric layer, and accordingly implementing the adjustment of the adjustable capacitor. That is to say, the adjustable capacitor provided by the embodiment of the present disclosure achieve the adjustment of the adjustable capacitor by adjusting the electrical parameters, i.e., the dielectric constant of the ferroelectric dielectric layer, which takes advantage of the physical properties of the ferroelectric dielectric layer of the adjustable capacitor itself, e.g., a change of the strength of the electric field having the ferroelectric dielectric layer can cause a change in the dielectric constant, which in turn can cause a change in the capacitance of the capacitor between the first electrode and the second electrode. Compared with the existing technologies of achieve adjusting the capacitance of the capacitor by mechanically driving the mechanically adjustable end of the motor, the adjustable capacitor in the embodiment of the present disclosure adjusts the capacitance in a fast speed and short adjustment time and can adjust the capacitance of the capacitor in milliseconds or less.

Figure 2:
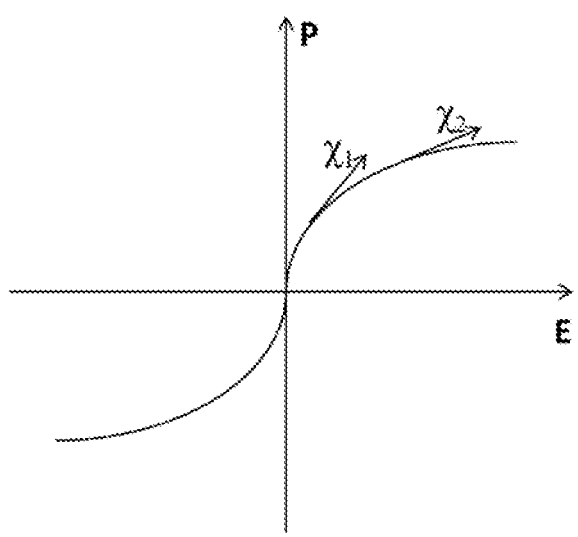
FIG. 2 is a schematic diagram showing a relationship between a polarization P of a ferroelectric dielectric layer and an electric field E.

To provide further understanding, the principle of adjusting the capacitance of the adjustable capacitor provided in this embodiment is explained below. FIG. 2 is a schematic diagram showing a relationship between a polarization, P, of the ferroelectric material and an applied electric field, E. In the ferroelectric material for the ferroelectric dielectric layer, when an electric field is applied, macroscopic dipoles appear in the direction of the electric field inside the ferroelectric material, and polarized charges appear on a surface of the dielectric. The polarization of the polarized charges, P (a dielectric electric dipole moment vector sum in a volume unit), is related to both the magnitude of the electric field and the direction of the electric field. The polarization rate of the dielectric x=P/E, is expressed as a slope of each point of the curve in FIG. 2, the stronger the electric field, E, is, the smaller the polarization rate of the dielectric, P, is. For the dielectric, the relationship among the electric induction strength, D, the electric field strength, E, and the polarization, P, is as follows:

$D=\varepsilon_0 E+P$ $D=(\varepsilon_0+\chi)E=\varepsilon_0\varepsilon_r E$ $\varepsilon_r=1+\chi/\varepsilon_0$ wherein: $\varepsilon_0$ is the vacuum dielectric constant, and $\varepsilon_r$ is the relative dielectric constant.

For dielectric parallel plate capacitors, the capacitance $C=\varepsilon_0\varepsilon_r S/d$, S is the equivalent face area of the parallel electrode plates, and d is the distance between the two parallel electrode plates.

It can be seen from the above analysis that for a capacitor using ferroelectric material as dielectric material, when an electric field having the capacitor changes rapidly, the corresponding dielectric constant $\varepsilon_r$ changes rapidly, so that the capacitance of the adjustable capacitor can be quickly adjusted.

In summary, by adjusting the dielectric in a short time period of milliseconds or less to adjust the electric field strength, the objective of adjusting the capacitance of the adjustable capacitor in milliseconds or less can be achieved.

In this embodiment, at least a portion of the ferroelectric dielectric layer is simultaneously disposed in an electric field between the first control electrode and the second control electrode and in an electric field between the first electrode and the second electrode, such that the portion of the ferroelectric dielectric layer can cause the dielectric constant changes due to the effect of the change of the electric field between the first control electrode and the second control electrode, and the portion of the ferroelectric dielectric layer acts as a dielectric layer between the first electrode and the second electrode. According to the capacitance formula, due to the dielectric constant changes, the capacitance between the first electrode and the second electrode also changes, thereby ensuring a change of the strength of the electric field having the first control electrode and the second control electrode, to effectively adjust the capacitance between the first electrode and the second electrode and implement the adjustment of the capacitance of the adjustable capacitor.

Figure 3:
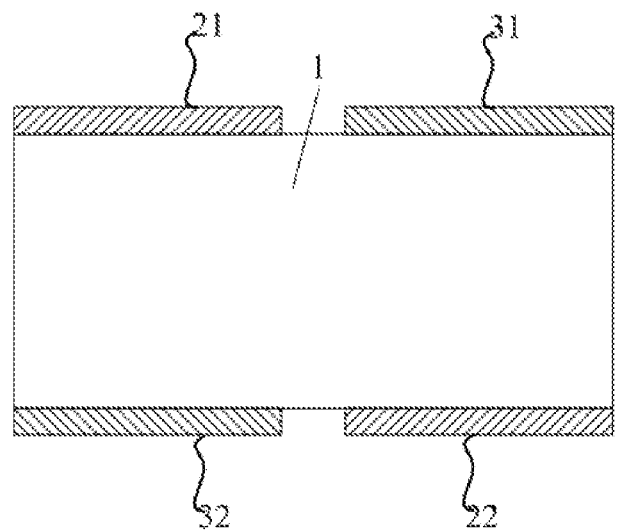
FIG. 3 is a schematic structural diagram of an adjustable capacitor according to the Embodiment One of the present disclosure.

Optionally, as shown in FIG. 3, it is a structural schematic diagram of the adjustable capacitor in the embodiment. In this embodiment, the adjustable capacitor includes: a ferroelectric dielectric layer 1, a first electrode 21 and a second electrode 22 on opposite sides of the ferroelectric dielectric layer 1, and a control electrode 31 and a second control electrode 32 insulated from the first electrode 21 and the second electrode 22. The first electrode 21 and the first control electrode 31 are both disposed on an upper side of the ferroelectric dielectric layer 1; the first electrode 21 is disposed on a left side, the first control electrode 31 is disposed on a right side; the second electrode 22 and the second control electrode 32 are both disposed on a lower side of the ferroelectric dielectric layer 1; the second electrode 22 is disposed on a right side, and the second control electrode 32 is disposed on a left side; orthographic projections of the first control electrode 31 and the second control electrode 32 on an upper surface of the ferroelectric dielectric layer 1 do not overlap. In this embodiment, when the adjustable capacitor is connected to the impedance matching device, the first electrode 21 and the second electrode 22 are connected to a circuit of the matching network, the first control electrode 31 and the second control electrode 32 are subjected to the control by a control unit in the impedance matching device, and a voltage applied between the first electrode 21 and the second electrode 22 can be adjusted. A specific electrical configuration is referred to FIG. 6.

Further, optionally, the second control electrode 32 is disposed opposite to the first electrode 21, and the orthographic projections thereof on the upper surface of the ferroelectric dielectric layer 1 at least partially overlap. The first control electrode 31 and the second electrode 22 are oppositely disposed, and the orthographic projections thereof on the upper surface of the ferroelectric dielectric layer 1 at least partially overlap. The first electrode 21, the second electrode 22, the first control electrode 31 and the second control electrode 32 are in an above positional relationship, so that the adjustable capacitor is small in volume and simple in structure.

Further, preferably, orthographic projections of the second control electrode 32 and the oppositely disposed first electrode 21 on the upper surface of the ferroelectric dielectric layer 1 are completely coincident; orthographic projections of the first control electrode 31 and the oppositely disposed second electrode 22 on the upper surface of the ferroelectric dielectric layer 1 are completely coincident, such that components of the adjustable capacitor can be more concentrated, and accordingly, the adjustable capacitor can be smaller in volume and simpler in structure.

Figure 4:
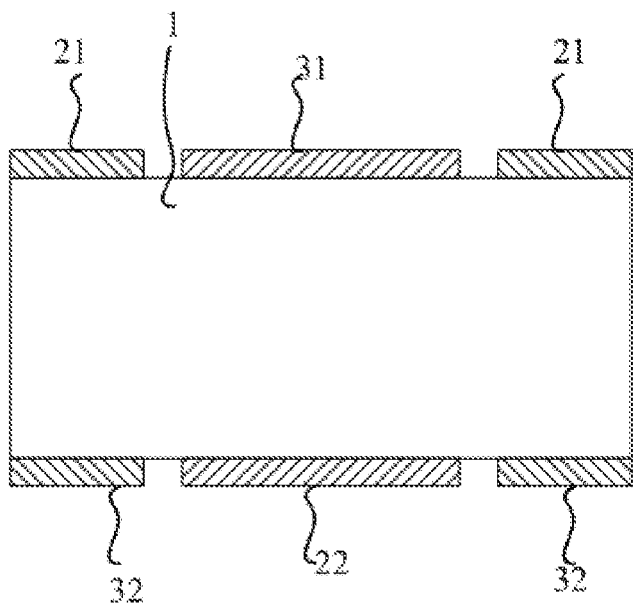
FIG. 4 is another schematic structural diagram of an adjustable capacitor according to the Embodiment One of the present disclosure.

In practical applications, the adjustable capacitor can also employ a structure shown in FIG. 4, which is different from FIG. 3, in that: the quantity of the second control electrodes 32 is two, and the second electrode 22 is disposed between the two control electrodes 32; the quantity of the first electrodes 21 is two, and the first control electrode 31 is disposed between the two first electrodes 21. Comparing with FIG. 3, the adjustable capacitor shown in FIG. 4 has more portions of the ferroelectric dielectric layer 1 simultaneously disposed in an electric field between the first control electrode 31 and the second control electrode 32 and in an electric field between the first electrode 21 and the second electrode 22, and accordingly, can increase the variation of the capacitance of the adjustable capacitor under the same electric field variation, thereby further increasing the adjustment rate of the capacitance of the adjustable capacitor.

Figure 5:
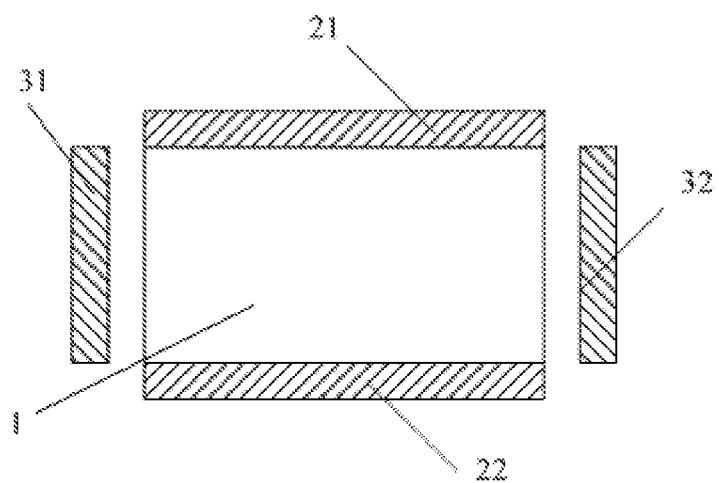
FIG. 5 is a further schematic structural diagram of an adjustable capacitor according to the Embodiment One of the present disclosure.

Optionally, as shown in FIG. 5, the first electrode 21 and the second electrode 22 of the adjustable dielectric capacitor in this embodiment are disposed on an upper side and a lower side of the ferroelectric dielectric layer 1, respectively; a first control electrode 31 and a second control electrode 32 are disposed on a left side and a right side of the ferroelectric dielectric layer 1, respectively. Of course, the first electrode 21 and the second electrode 22 of the adjustable dielectric capacitor may also be disposed on the left and right sides of the ferroelectric dielectric layer 1, respectively; the first control electrode 31 and the second control electrode 32 may also be disposed on the upper and lower sides of ferroelectric dielectric layer 1, respectively. In the adjustable capacitor shown in FIG. 5, the entire ferroelectric dielectric layer 1 can be simultaneously disposed in the electric field between the first control electrode 31 and the second control electrode 32 and in the electric field between the first electrode 21 and the second electrode 22, so that under the same electric field variation, the change of the capacitance of the adjustable capacitor can be further increased, thereby further increasing the adjustment rate of the capacitance of the adjustable capacitor.

The ferroelectric material for the ferroelectric dielectric layer 1 includes but is not limited to at least one of: $BaTiO_3$, $BaO-TiO_2$, $KNbO_3$, $K_2O-Nb_2O_5$, $LiNbO_3$, $Li_2O-Nb_2O_5$, potassium dihydrogen phosphate, triglycine sulfate and Rochelle salt.

Embodiment Two

Figure 6:
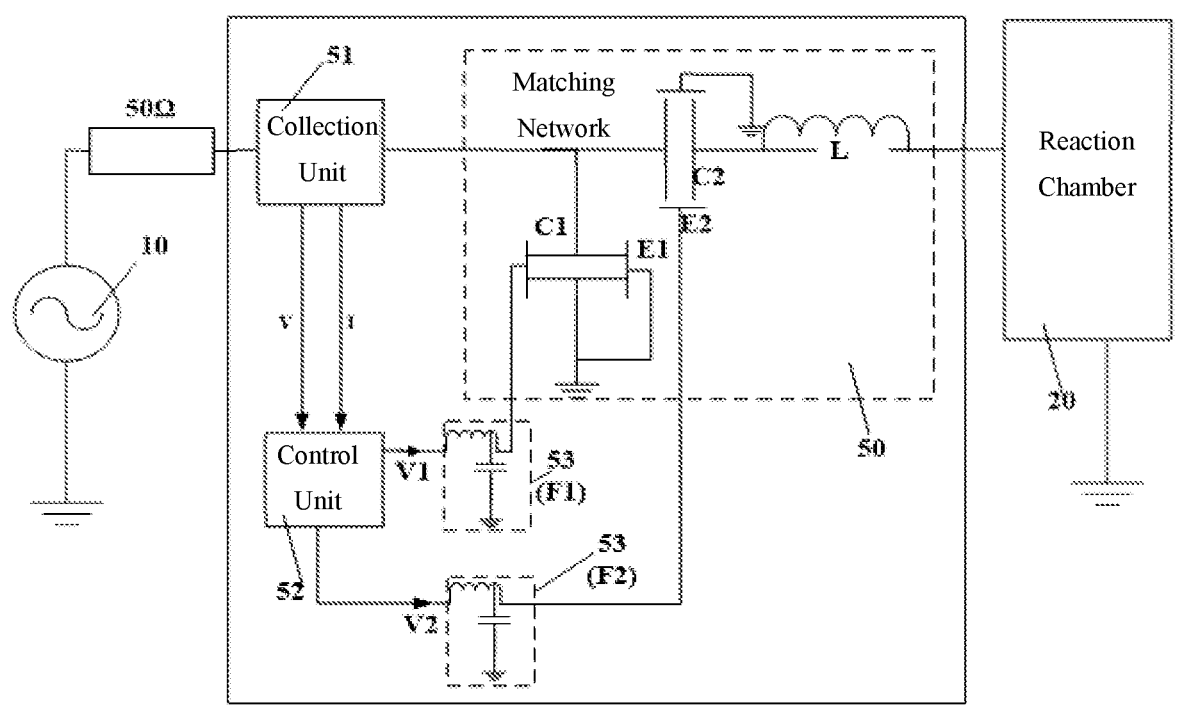
FIG. 6 is a schematic structural diagram of an impedance matching device according to the Embodiment Two of the present disclosure.

The present embodiment provides an impedance matching device. As shown in FIG. 6, the impedance matching device includes a matching network 50, an collection unit 51, and a control unit 52. The matching network 50 includes the adjustable capacitor provided in the above Embodiment One, the electrode 21 and the second electrode 22 are connected to the circuit of the matching network 50. The first control electrode 31 is electrically connected to the control unit 52, and the second control electrode 32 is grounded.

The matching network 50 is connected in series between the RF power source 10 and the reaction chamber 20; the collection unit 51 is configured to collect electrical signals in the transmission line between the RF power source 10 and the matching network 50, and send the electrical signals to the control unit 52; The control unit 52 is configured to perform an impedance matching operation according to the electrical signals collected by the collection unit 51, and control a voltage applied between the first control electrode 31 and the second control electrode 32 based on an operation result to adjust the capacitance between the first electrode 21 and the second electrode 22.

The collection unit includes, but is not limited to a sensor. A type of matching network 50 includes, but is not limited to, an L-type. The form of each unit in the impedance matching device in this embodiment is not unique. For example, the control unit 52 may be a digital signal processor (DSP), or may be a single chip microcomputer, etc. The specific algorithm based on which the control unit 52 performs the impedance matching operation is not limited to this embodiment, as long as the voltage is adjusted based on the operation result such that the output impedance of the RF power source 10 can be made equal to the load impedance.

In the impedance matching device of this embodiment, since the magnitude of the capacitance of the adjustable capacitor in the matching network is not required to be controlled by the execution unit and the adjustable capacitor according to Embodiment One is employed, only magnitude of the control voltages V1 and V2 outputted by the control unit 52 needs to be controlled. A rapid variation of the capacitance of the adjustable capacitor can implement fast matching and achieve a matching speed in milliseconds or less.

To assist understanding, the impedance matching device in this embodiment is explained in detail below with reference to FIG. 6.

As shown in FIG. 6, in this embodiment, the collection unit 51 in the impedance matching device is disposed at the front end of the matching network 50, and is configured for detecting electrical signals, i.e., voltage V, current I, in the transmission line of the RF power supply 10. The control unit 52 applies a certain phase and amplitude discrimination algorithm to obtain a modulus value $|Z|$ and a phase $\theta$ of the load impedance measured from an input end to an output end of the matching network 50, and provide a required control amount by the algorithm. The components employed in the matching network 50 are composed of adjustable capacitors, C1 and C2, and an inductor L, the capacitors C1 and C2 are the adjustable capacitors described in the foregoing Embodiment One; the adjustable capacitors C1 and C2 are each in the electric field, E1, and E2, provided by a corresponding control electrode thereof. Electric field strength of E1 and E2 can be implemented by controlling the control voltages V1 and V2 applied to the control electrodes by the control unit 52. The control unit 52 adjust the control voltages V1 and V2 applied to the control electrodes, based on the electrical signals collected by the collection unit 51 through the matching control algorithm, to achieve rapid adjustment of the capacitance of the adjustable capacitors C1 and C2, so that the load impedance of the matching network 50 is equal to the output impedance of the RF power source 10 (usually 50Ω) and cause the load and the RF power source achieve fast conjugate matching. At this time, the reflected power of the transmission line of the RF power source 10 is zero or small, and the power generated by the RF power source 10 is all transmitted to the reaction chamber 20.

Optionally, as shown in FIG. 6, the impedance matching device further includes a low-pass filter 53 (F1 and F2); the low-pass filter 53 is disposed between the control unit 52 and the first control electrode 31. Regarding the specific configuration of the low-pass filter 53, the embodiment does not impose any specific limitation. For example, the low-pass filter 53 includes an inductor and a capacitor. One end of the inductor is connected to the output end of the control unit 52, the other end is connected to one end of the adjustable capacitor, and the other end of the adjustable capacitor is grounded and connected to the control electrode thereof. After adjusting the voltages V1 and V2 of the two control electrodes, the control unit 52 controls the strength of E1 and E2 through the low-pass filters, F1 and F2, respectively, and some signal interferences can be filtered out by the low-pass filters.

Optionally, the quantity of the adjustable capacitors is plural, and the low-pass filters and the adjustable capacitors are correspondingly configured and have equal quantity. For example, as shown in FIG. 6, there are two adjustable capacitors, C1 and C2, respectively, and there are also two low-pass filters, F1 and F2, respectively; and the adjustable capacitor C1 is connected to the control unit 52 through the low-pass filter F1, the adjustable capacitor C2 is connected to the control unit 52 through the low-pass filter F2.

It should be noted that the impedance matching device in this embodiment is not limited to being applied to a plasma system. It can also be applied to other systems such as communication, nuclear magnetic, power transmission lines, etc.

Embodiment Three

Figure 7:
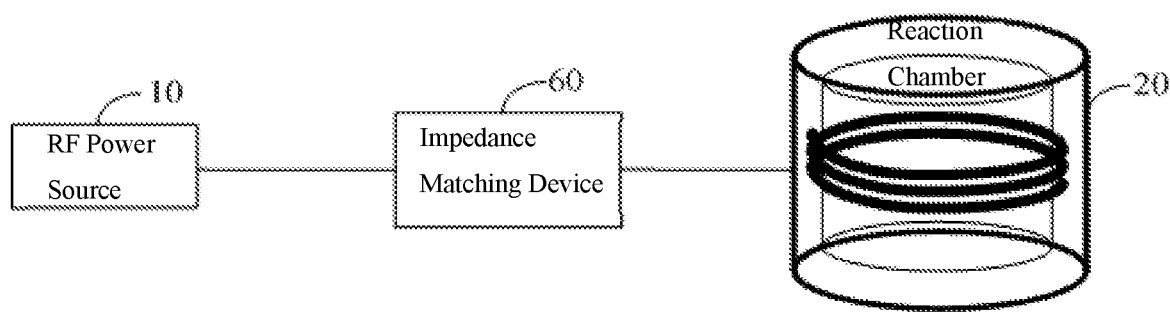
FIG. 7 is a schematic structural diagram of a semiconductor processing apparatus according to the Embodiment Three of the present disclosure.

The present embodiment provides a semiconductor processing apparatus. As shown in FIG. 7, the semiconductor processing apparatus includes an RF power source 10, an impedance matching device 60, and a reaction chamber 20; the impedance matching device 60 is connected in series between the RF power source 10 and the reaction chamber 20, configured to match the output impedance of the RF power source with the load impedance. The impedance matching device 60 employs the impedance matching device provided in the above Embodiment Two.

The semiconductor processing apparatus in this embodiment employs the impedance matching device provided in the Embodiment Two, to achieve fast matching between the output impedance of the RF power source and the load impedance, thereby improving processing efficiency and processed result.

It is to be understood that the above embodiments are merely exemplary embodiments employed to explain the principles of the present disclosure, but the present disclosure is not limited thereto. Various modifications and improvements can be made by those skilled in the art without departing from the spirit and scope of the present disclosure. These modifications and improvements are also considered to be within the scope of the present disclosure.

What is claimed is:

1. An adjustable capacitor, comprising:
a ferroelectric dielectric layer;
a first electrode and a second electrode disposed on opposite sides of the ferroelectric dielectric layer; and
a first control electrode and a second control electrode separated and insulated from the first electrode and the second electrode, the first control electrode and the second control electrode being disposed on opposite outer sides of the same ferroelectric dielectric layer and configured to provide an electric field to the ferroelectric dielectric layer, to adjust a dielectric constant by controlling an electric field strength and to adjust a capacitance between the first electrode and the second electrode.

2. The adjustable capacitor according to claim 1, wherein one or more portions of the ferroelectric dielectric layer are simultaneously disposed in an electric field between the first control electrode and the second control electrode and in an electric field between the first electrode and the second electrode.

3. The adjustable capacitor according to claim 2, wherein the first electrode and the second electrode are disposed on a left side and a right side of the ferroelectric dielectric layer, respectively, and the first control electrode and the second control electrode are disposed on an upper side and a lower side of the ferroelectric dielectric layer, respectively.

4. The adjustable capacitor according to claim 1, wherein the first electrode and the first control electrode are both disposed on an upper surface of the ferroelectric dielectric layer, the first electrode being disposed on a left side of the upper surface and the first control electrode being disposed on a right side of the upper surface, the second electrode and the second control electrode are both disposed on a lower surface of the ferroelectric dielectric layer, the second electrode being disposed on a right side of the lower surface and the second control electrode being disposed on a left side of the lower surface, an orthographic projection of the first control electrode not overlapping with an orthographic projection of the second control electrode on an upper surface of the ferroelectric dielectric layer.

5. The adjustable capacitor according to claim 4, wherein the second electrode is disposed between two second control electrodes, and the first control electrode is disposed between two first electrodes.

6. The adjustable capacitor according to claim 4, wherein the second control electrode is disposed opposite to the first electrode, and the first control electrode is disposed opposite to the second electrode.

7. The adjustable capacitor according to claim 6, wherein an orthographic projection of the second control electrode on the upper surface of the ferroelectric dielectric layer partially overlaps with an orthographic projection of the oppositely disposed first electrode on the upper surface of the ferroelectric dielectric layer, and an orthographic projection of the first control electrode on the upper surface of the ferroelectric dielectric layer partially overlaps with an orthographic projection of the oppositely disposed second electrode on the upper surface of the ferroelectric dielectric layer.

8. The adjustable capacitor according to claim 6, wherein an orthographic projection of the second control electrode on an upper surface of the ferroelectric dielectric layer are completely coincident with an orthographic projection of the oppositely disposed first electrode on the upper surface of the ferroelectric dielectric layer, and an orthographic projection of the first control electrode on the upper surface of the ferroelectric dielectric layer is also completely coincident with an orthographic projection of the second electrode on the upper surface of the ferroelectric dielectric layer.

9. The adjustable capacitor according to claim 1, wherein the first electrode and the second electrode are disposed on an upper side and a lower side of the ferroelectric dielectric layer, respectively, and the first control electrode and the second control electrode are disposed on a left side and a right side of the ferroelectric dielectric layer, respectively.

10. The adjustable capacitor according to claim 1, wherein the material for the ferroelectric dielectric layer comprises one or more of: $BaTiO_3$, $BaO$—$TiO_2$, $KNbO_3$, $K_2O$—$Nb_2O_5$, $LiNbO_3$, $Li_2O$—$Nb_2O_5$, potassium dihydrogen phosphate, triglycine sulfate and Rochelle salt.

11. An impedance matching device, comprising:
a matching network connected in series between an RF power source and a reaction chamber, the matching network comprising an adjustable capacitor, the adjustable capacitor comprising;
a ferroelectric dielectric layer;
a first electrode and a second electrode disposed on opposite sides of the ferroelectric dielectric layer; and
a first control electrode and a second control electrode separated and insulated from the first electrode and the second electrode, the first control electrode and the second control electrode being disposed on opposite outer sides of the same ferroelectric dielectric layer and configured to provide an electric field to the ferroelectric dielectric layer, to adjust a dielectric constant by controlling an electric field strength- and to adjust a capacitance between the first electrode and the second electrode;

a collection unit configured to collect electrical signals in a transmission line between the RF power source and the matching network; and a control unit configured to perform an impedance matching operation based on the electrical signals collected by the collection unit and control a voltage applied between the first control electrode and the second control electrode based on an operation result;

wherein the collection unit sends the collected electrical signals to the control unit; the first electrode and the second electrode are connected to a circuit of the matching network, the first control electrode is electronically connected to the control unit, and the second control electrode is grounded.

12. The impedance matching device according to claim 11, further comprises a low-pass filter disposed between the control unit and the first control electrode.

13. The impedance matching device according to claim 12, wherein a plurality of adjustable capacitors are included, a plurality of low-pass filters are included, a quantity of the low-pass filters is equal to a quantity of the adjustable capacitors, and the low-pass filters and the adjustable capacitors are correspondingly configured.

14. A semiconductor processing apparatus, comprising:
an RF power source;
a reaction chamber; and
an impedance matching device connected in series between the RF power source and the reaction chamber, comprising:
a matching network connected in series between the RF power source and the reaction chamber, the matching network comprising an adjustable capacitor, the adjustable capacitor comprising:
a ferroelectric dielectric layer;
a first electrode and a second electrode disposed on opposite sides of the ferroelectric dielectric layer; and a first control electrode and a second control electrode separated and insulated from the first electrode and the second electrode, the first control electrode and the second control electrode being disposed on opposite outer sides of the same ferroelectric dielectric layer and configured to provide an electric field to the ferroelectric dielectric layer, to adjust a dielectric constant by controlling an electric field strength- and to adjust a capacitance between the first electrode and the second electrode;

a collection unit configured to collect electrical signals in a transmission line between the RF power source and the matching network; and a control unit configured to perform an impedance matching operation based on the electrical signals collected by the collection unit and control a voltage applied between the first control electrode and the second control electrode based on an operation result;

wherein the collection unit sends the collected electrical signals to the control unit; the first electrode and the second electrode are connected to a circuit of the matching network, the first control electrode is electronically connected to the control unit, and the second control electrode is grounded.

15. The impedance matching device according to claim 11, wherein the collection unit comprises a sensor.

16. The impedance matching device according to claim 11, wherein the matching network comprises an L-type network.

17. The impedance matching device according to claim 11, wherein the control unit is one of: a DSP and a single chip microcomputer.

18. The impedance matching device according to claim 11, wherein the second electrode is disposed between two second control electrodes—and the first control electrode is disposed between two first electrodes.

19. The semiconductor processing apparatus according to claim 14, wherein the second electrode is disposed between two second control electrodes—and the first control electrode is disposed between two first electrodes.

* * * * *